METHOD OF INFLUENCING THE SURFACE PROFILE OF SEMICONDUCTOR LAYERS PRECIPITATED FROM THE GAS PHASE

Filed Aug. 10, 1965

United States Patent Office 3,419,424
Patented Dec. 31, 1968

3,419,424
METHOD OF INFLUENCING THE SURFACE PROFILE OF SEMICONDUCTOR LAYERS PRECIPITATED FROM THE GAS PHASE

Hermann Steggewentz and Kurt Schlüter, Munich, Germany, assignors to Siemens Aktiengesellschaft, Munich, Germany Filed Aug. 10, 1965, Ser. No. 478,564
Claims priority, application Germany, Aug. 21, 1964, S 92,746
6 Claims. (Cl. 117—201)

Figure 1:
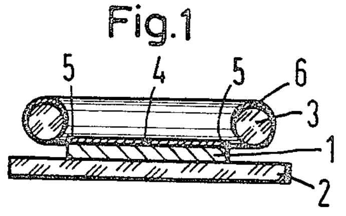

Our invention relates to a method of precipitating preferably monocrystalline layers of semiconductor material upon heated, crystalline substrates by thermal decomposition of a gaseous compound of the semiconductor material to be precipitated.

Such methods of growing epitaxial coatings are generally carried out by placing the substrates upon a heater or carrier structure from which the substrates are heated to a sufficiently high temperature to decompose the gaseous semiconductor compound to cause precipitation of the semiconductor material. The substrates may consist of the semiconductor material to be precipitated or of another material, which should however fulfill certain conditions with respect to melting point, lattice structure and lattice dimension.

Many materials are suitable for the carrier structure, but quartz is most often used. Quartz exhibits a high temperature resistance and is obtainable in highly pure form so that, at the high temperatures of the reaction, the carrier will not give off impurities which would undesirably contaminate the semiconductor layers being formed and would interfere with the reproducibility of the layer properties, the high capacity for reproducible results of the epitaxial methods being their outstanding advantage and of considerable technological importance.

However, it has been found that it is not possible to obtain unobjectionable planar semiconductor layers if the substrate to be coated, particularly a wafer, is placed flat upon a planar base such as of quartz. Rather, the layers exhibit a bead-like boundary curvature resulting from the thickening of the precipitated layer at the edge. For further fabrication to semiconductor devices, these layers must first be cut or etched into planar layers which, in addition to requiring a further processing step, causes considerable loss of valuable semiconductor material.

It is accordingly a primary object of our invention to provide vertically perfect planar surfaces of semiconductor layers by the thermal decomposition of gaseous compounds of the semiconductor materials.

It is another object of our invention to provide a method which can result in the formation of predetermined surface profiles in the precipitation of semiconductor materials from gaseous compounds thereof onto a substrate in such manner, whereby, as desired, either planar layers are obtained, or surfaces of particular profile are obtained.

Other objects and advantages of our invention will be apparent from the further reading of the specification and of the appended claims.

With the above and other objects in view, the present invention mainly comprises the influencing of the surface profile of semiconductor materials to produce planar or other surfaces of semiconductor materials by the thermal decomposition of the gaseous compound of the semiconductor material, preferably in monocrystalline form, on a crystalline substrate, wherein in the vicinity of the surface portions of the substrate a precipitation of semiconductor material is prevented or partially reduced to prevent deposition of an excess of semiconductor material, by locating a body of inert material in spaced relation to the surface of the substrate to be coated. Thus, a portion of semiconductor material formed in the vicinity of these surface portions as a result of the thermal decomposition, is wholly or partially kept off the surface portions and instead precipitates on the inert body.

Figure 2:
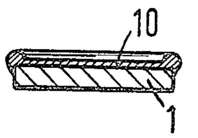
Figure 3:
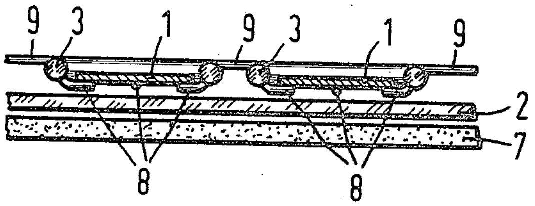
Figure 4:
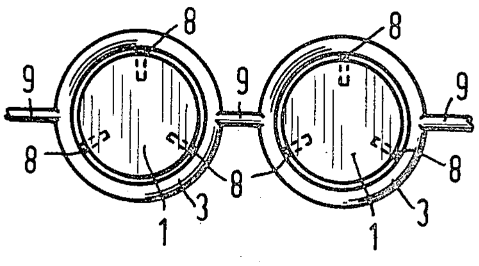

The invention is more fully illustrated by way of example in the accompanying drawings, in which, FIG. 1 diagrammatically shows in section an arrangement for carrying out the surface coating method of our invention;

FIG. 2 shows a disc with a growth layer of semiconductor material thereon produced according to known methods;

FIG. 3 diagrammatically shows in section a further arrangement for carrying out the method of our invention; and FIG. 4 is a top plan view of FIG. 3.

Referring more particularly to the drawings, there is shown in FIG. 1 a base 2, for example of quartz, on which is applied the substrate 1 to be coated, such as a monocrystalline disc of silicon or germanium. FIG. 1 shows for simplicity only a single disc 1 in cross section. A body 3 of inert material is located in the region of the surface portions of disc 1 on which the precipitation should be prevented or at least partially reduced. The body 3 does not contact the base body to be coated. In this example, the body of inert material consist of quartz and has the shape of a ring.

Instead of quartz, the inert material may consist of another substance, provided the same is temperature resistant and non-reactive under the precipitation conditions, that is, the material must not melt and not give off any substances which will act as impurities in the semiconductor material to be precipitated. Obviously, it also should not either form alloys or in any other way react with the semiconductor material to be precipitated or with the material of the substrate. Thus, for example, graphite, molybdenum, germanium, silicon, or silicon carbide are also suitable for this purpose. The inert body may also be formed of quartz with a graphite coating. In may cases, there may be used different types of bodies coated with the particular semiconductor material to be precipitated.

By heat transfer, primarily from the heated base, the added protective inert body is brought to a temperature close to that of the base. The temperature of the added inert body can also be somewhat above the temperature of the base body. In general, however, the added body is not separately heated, so that by heat transfer from the base body its temperature is somewhat below the temperature of the substrate to be coated.

The inner diameter of the ring 3 in FIG. 1 approximately corresponds to the diameter of the disc 1. The disc 1 in this example has a diameter in the range of 20–25 mm. As shown in FIG. 1, the ring 3 is preferably arranged above the surface of the disc 1 to be coated so that the distance of the edge of the disc from the ring is throughout about the same, that is, the disc is about symmetrically arranged relative to the ring.

In order to still more fully illustrate the invention, without, however, being limited to the specific details thereof, several numerical examples are given below.

For a disc of about 25 mm. diameter it is advantageous to use a ring with an inner diameter of about 24.5–25.5 mm. The thickness of the ring is preferably about 1 mm. A ring of molybdenum is formed, for example, of a 1 mm. diameter wire.

For a disc having a diameter of about 20 mm., it is advantageous to use a ring having an inner diameter of about 19.5–20.5 mm.

With the use of such or similar measurements of ring 3 and disc 1, there is obtained a substantially planar grown epitaxial layer on the disc.

We have found that the region of action of the added body of our invention extends nearly uniformly toward all sides. Thus, for example, if a ball of 1 mm. diameter is arranged near the disc to be coated, the surface profile of the precipitated layer obtained exhibits a trough-shaped depression in the region of the ball, the distance of the ball being such that, at the desired thickness of the layer of semiconductor material which precipitates on the substrate disc, a contact between the ball and the grown layer is just about to occur. With a ball diameter of about 1 mm. the trough extends to a diameter of 1.5–2 mm. depending upon the thickness of the precipitated layer.

In the example illustrated by FIG. 1, the ring 3 effects a noticeable action in a surrounding region of up to about 0.5 mm. The distance of the ring 3 from the disc surface can thus be adjusted to be about 0.5 mm. Since the thickness of the growth layer is in general far below this size, for example it generally lies in the region of several microns, the ring does not become attached to the disc and can be easily removed after coating the disc.

The thickness of the semiconductor layer 6 which grows on the ring 3 corresponds approximately to the monocrystalline growth layer 4 on the substrate 1. The growth on ring 3 is generally in polycrystalline form. In order to use the ring for additional applications, it is advantageous to use a ring made of material which is resistant to the solvents for the semiconductor material which precipitates thereon. In principle it is, of course, possible to remove the growth material mechanically. However, chemical dissolution of the same results in considerably less difficulties.

As shown in FIG. 1, there is obtained a disc 1 with a planar semiconductor layer 4 thereon, which if desired, is slightly rounded off at the edge.

In contrast thereto, FIG. 2 shows a disc 1 with a semiconductor layer 10 thereon formed by precipitation from the gas phase in the conventional manner, without the use of the conditions of our invention, and here the semiconductor layer 10 exhibits a considerable bulge at the edge.

The method of our invention is advantageously applicable wherever predetermined surface profiles of semiconductor layers by precipitation from the gas phase are desired, and the exact structure and profile can be varied for particular requirements. The additional body which is used can have any desired shape in order to provide any desired surface profile. For example, it is possible to use waveshaped or meandershaped bodies, to produce meandershaped semiconductor structures on top of an elongated substrate crystal.

According to a further embodiment of our invention it is possible to use the added body so that it simultaneously acts as transport agent for the substrate to be coated. In this case it is, for example, possible to properly position the substrate and the added body relative to each other while both are still outside the reaction vessel, so that the charging of the reaction vessel can be thereafter effected particularly rapidly. This may be done, for example, as follows. The substrates 1 to be coated, which in this example are in the form of discs as shown in FIGS. 3 and 4, are to be placed on supports 8 which consist of fingers attached to the added body, for example the ring 3. Each disc 1 thus is placed together with one of the respective rings 3. In order to obtain a good support of the discs, it is necessary to use at least three supporting fingers on each ring. For the simultaneous transport of several disc-ring assemblies, the rings 3 are fixed to rods 9.

The heating of the substrates 1 to the precipitation temperature, for example in the case of silicon to about 1200° C. and for germanium to about 850–900° C., is effected in the example with the aid of a heater 7 by heat transfer through the quartz base 2.

While the invention has been illustrated in connection with the obtaining of certain particular profiles in the precipitation of semiconductor layers by decomposition of a gaseous compound of the semiconductor material, it is to be understood that variations and modifications can be made without departing from the spirit or scope of the invention. Such variations and modifications are therefore meant to be comprehended within the meaning and scope of equivalence of the appended claims.

We claim:

1. The method of producing a crystalline semiconductor layer of predetermined profile on a crystalline substrate by thermal decomposition of a gaseous compound of said semiconductor material and precipitation on said substrate which is heated to above the decomposition temperature of said gaseous compound, which comprises placing a solid ring, having an inner diameter approximately equal to that of said substrate, which is disc-shaped, has a thickness of about 1 mm. and consists of inert material in the precipitation path of the semiconductor material adjacent to, and spaced from, a given portion of the surface of said substrate, and reducing by the proximity of said body to said given surface portion the amount of semiconductor material precipitating onto said portion.

2. The method according to claim 1, wherein said material of said body is selected from the group consisting of graphite, quartz, molybdenum, germanium, silicon and silicon carbide.

3. The method according to claim 2, wherein said semiconductor material is selected from the group consisting of silicon and germanium.

4. The method according to claim 1, in which said body is formed of quartz coated with graphite.

5. The method according to claim 1, which comprises placing said substrate disc upon radially inward protuberances of said ring in a substantially symmetrical position relative to said ring.

6. The epitaxial method of growing monocrystalline layers of semiconductor material on monocrystalline substrates, which comprises surrounding circular substrate discs by circular rings formed of inert material and having an inner diameter substantially equal to the disc diameter, assembling each disc and ring in a relative position in which the ring is juxtaposed to the disc face that is to receive the epitaxial layer but is spaced therefrom just enough to remain separate upon termination of layer growth, and thereafter subjecting the disc-ring assemblies to epitaxial precipitation of semiconductor material from a gaseous phase thereof by heating said assemblies.

References Cited

UNITED STATES PATENTS

| | | | |
|---|---|---|---|
| 3,142,596 | 7/1964 | Theuerer | 148—175 |
| 3,172,792 | 3/1965 | Handelman | 117—201 |
| 3,226,254 | 12/1965 | Reuschel | 117—201 |

WILLIAM L. JARVIS, *Primary Examiner.*

U.S. Cl. X.R.

117—106; 23—223.5